United States Patent
Pabst

(10) Patent No.: US 10,404,385 B2
(45) Date of Patent: Sep. 3, 2019

(54) MEASUREMENT SYSTEM AND A METHOD

(71) Applicant: Rohde & Schwarz GmbH & Co. KG, München (DE)

(72) Inventor: Alexander Pabst, Taufkirchen (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 264 days.

(21) Appl. No.: 15/414,566

(22) Filed: Jan. 24, 2017

(65) Prior Publication Data

US 2018/0041289 A1 Feb. 8, 2018

(30) Foreign Application Priority Data

Aug. 3, 2016 (EP) .................................... 16182656
Nov. 25, 2016 (EP) .................................... 16200663

(51) Int. Cl.
| | | |
|---|---|---|
| *H04B 17/29* | (2015.01) | |
| *H04B 17/10* | (2015.01) | |
| *G01R 29/08* | (2006.01) | |
| *H04B 17/00* | (2015.01) | |
| *H04B 17/318* | (2015.01) | |

(52) U.S. Cl.
CPC ....... *H04B 17/103* (2015.01); *G01R 29/0878* (2013.01); *H04B 17/0085* (2013.01); *H04B 17/29* (2015.01); *H04B 17/318* (2015.01)

(58) Field of Classification Search
CPC .................................................. H04B 17/103
USPC ....................................................... 455/425
See application file for complete search history.

(56) References Cited

U.S. PATENT DOCUMENTS

| | | | |
|---|---|---|---|
| 7,254,327 B1 * | 8/2007 | Zhong ................ | H04B 10/0775 398/33 |
| 2002/0119754 A1 | 8/2002 | Wakutsu et al. | |
| 2004/0153890 A1 | 8/2004 | Davis et al. | |
| 2007/0254643 A1 | 11/2007 | Garcia et al. | |
| 2008/0056340 A1 | 3/2008 | Foegelle | |
| 2009/0284426 A1 * | 11/2009 | Snow ..................... | G01R 29/10 343/703 |
| 2010/0327766 A1 | 12/2010 | Recker et al. | |
| 2011/0071508 A1 * | 3/2011 | Duval ................. | A61B 1/00087 606/1 |
| 2011/0237199 A1 | 9/2011 | Venkataraman et al. | |
| 2012/0042213 A1 | 2/2012 | Zimmerman | |
| 2013/0271317 A1 | 10/2013 | Goel et al. | |
| 2014/0087668 A1 | 3/2014 | Mow et al. | |
| 2014/0091961 A1 | 4/2014 | Foegelle | |
| 2014/0266929 A1 | 9/2014 | Huynh et al. | |
| 2014/0270211 A1 | 9/2014 | Solum et al. | |

(Continued)

OTHER PUBLICATIONS

Communication of the Extended European Search Report for European Patent Application No. 16182656.5 dated Jan. 25, 2017

(Continued)

*Primary Examiner* — Joel Ajayi
(74) *Attorney, Agent, or Firm* — Shumaker & Sieffert, P.A.

(57) ABSTRACT

A measurement system for measuring signals in a RF device comprises at least two signal generators for generating a test signal in each one of the signal generators, a probe for every signal generator, each probe being connected to the respective signal generator for emitting the respective test signal to the RF device, and a controllable positioner for rotatably positioning the RF device with respect to the probes.

14 Claims, 4 Drawing Sheets

(56) References Cited

U.S. PATENT DOCUMENTS

2017/0103028 A1    4/2017    Neeb et al.
2017/0111258 A1    4/2017    Bezold et al.
2017/0127191 A1    5/2017    Solum et al.
2017/0180372 A1    6/2017    Bezold et al.

OTHER PUBLICATIONS

Extended European Search Report from counterpart European Patent Application No. EP 16200663.9, dated May 15, 2017, 7 pp.
Examination Report from counterpart European Application No. 16182656.5, dated Jan. 2, 2019, 6 pp.
Examination Report from counterpart European Application No. 16200663.9, dated Oct. 2, 2018, 5 pp.

* cited by examiner

MEASUREMENT SYSTEM AND A METHOD

PRIORITY CLAIM

This application claims the benefit of European Application No. 16182656.5, filed Aug. 3, 2016, and European Application No. 16200663.9, filed Nov. 25, 2016; the disclosures of each which are incorporated herein by reference in their entireties.

TECHNICAL FIELD

The invention relates to a measurement system and a method for measuring signal strength in a RF device.

BACKGROUND

Although applicable to any system that uses wireless signals, the present invention will be described in combination with testing of wireless communication devices.

Modern wireless communication devices use radio frequency signals to transmit data and/or speech. Manufacturers of such communication devices always try to improve the efficiency of the communication devices and at the same time have to fulfill legal or standard regulations.

Therefore, extensive testing of such communication devices is performed during development, production and after production. Such testing serves quality assurance and compliance tests. One test comprises measuring the Total Isotropic Sensitivity, TIS, of the respective device.

SUMMARY

There is a need for improved measuring of the TIS of RF devices.

A measurement system for measuring signals in a RF device comprises at least two signal generators or on single signal generator with two outputs for generating a test signal in each one of the signal generators, a probe for every signal generator, each probe being connected to the respective signal generator for emitting the respective test signal to the RF device, and a controllable positioner for rotatably positioning the RF device with respect to the probes.

A method for measuring signals in a RF device comprises generating at least two test signals, emitting the respective test signals to the RF device with one probe for each test signal, and rotatably positioning the RF device with respect to the probes.

In modern communication systems, like e.g. smartphone or other mobile equipment, especially so called 5G equipment, antennas or antenna arrays can be used, which are capable of receiving and distinguishing signals received via different signal paths. Such antenna arrays can e.g. perform beam forming and are therefore advantageous for improving the signal quality or signal strength in mobile data communications.

As already stated above, it is necessary to determine the characteristics of such RF devices, like e.g. the TIS to assure compliance with legal or other rules, like certain standards.

The present invention provides a measurement system, which supports TIS measurements in RF devices. During the measurements the RF device can be in a measurement mode and measure the signals received via its antenna, e.g. via internal measurement units. Such units can e.g. be embedded in the transceiver of the RF device. That means that the measurement system does not necessarily need to perform the measurement but can rely on the RF device to perform the measurements.

When performing TIS measurements of RF devices, the respective RF device is exposed to predetermined RF signals from different directions. The TIS can be seen as an average sensitivity of a receiving device, averaged over the entire three-dimensional space. The results of a TIS measurement is usually related to the antenna patterns of the antenna in the RF device.

The present invention supports the TIS measurement especially in RF devices, which use high frequencies, such that beam forming and multi-path signal transmission can happen. Such devices can e.g. use 5 GHz, 28 GHz, 60 GHz, any frequency in between or higher frequencies for signal transmission/reception.

The different signal generators can be synchronized to a virtual base signal, i.e. the signal, which a communication partner of the RF device would emit. However, the signal generators then generate test signals, which simulate the transmission of the base signal to the RF device via different signal paths. This simulation can e.g. include performing phase changes and polarization changes of the base signal.

The probes can be directed to the RF device, i.e. the test signals are directly emitted to the RF device from the positions of the respective probes. However, the signal generators provide the test signals such, that the signal characteristics are modified according to the simulated transmission paths.

The positioner, e.g. a 3D-positioner, can at least rotate the RF device. That means that the RF device is somehow fixed to a rotatable part of the positioner and can be rotated such that the emissions of the probes hit the RF device from different angles.

The present invention therefore allows providing the RF device with simulated real-world signals from different angels, and therefore allows effectively measuring the TIS of the RF device.

Further embodiments of the present invention are subject of the further subclaims and of the following description, referring to the drawings.

In a possible embodiment, the measurement system can comprise a data recorder for recording at least the signal strengths of the test signals received at the RF device. The data recorder can also record other parameters of the test signals, like e.g. the frequency, the phase, the amplitude, or the like. The data recorder can e.g. be coupled to the RF device via a digital data interface. The RF device can comprise a unit, e.g. a transceiver, with respective measurement capabilities. That unit can transmit via the digital data interface the signal strengths and/or the other parameters of the test signals received at the RF device to the data recorder for later analysis and/or visualization. As an alternative, the data recorder can be coupled to test connectors of the RF device and directly record the signal strengths and/or the other parameters.

In a possible embodiment, the probes can be rotatable around a first axis. This allows changing the incident angle of the single test signals at the RF device, and therefore simulating different environments. The probes can e.g. each be mounted onto rods or poles, which are rotatably mounted on the first axis, similar to the hands of a clock.

In a possible embodiment, the RF device can be positioned on the first axis. This allows easily focusing the probes to the RF device, even when the probes are rotated around the first axis.

In a possible embodiment, the distance of the probes to the axis can be configurable. This allows further configuring the test environment.

In a possible embodiment, at least one of the test signals can characterize a signal received by the RF device via a direct line of sight. A direct line of sight is the simplest form of signal transmission path, which is important to consider in the TIS measurements. This test signal can therefore e.g. be the raw base signal, or the raw base signal adapted for the intended distance between the RF device and the emitter.

In a possible embodiment, at least one of the test signals can characterize a signal received by the RF device indirectly via reflection. Signal reflection can especially occur in environments with many obstacles, like buildings, lamp posts or the like. Such obstacles are usually provided in environments like e.g. streets, cities and villages. Including these type of signal transmission can therefore improve the accuracy of the measurements.

In a possible embodiment, every test signal can characterize a signal emitted from a single signal source to the RF device via diverging paths or emitted from different signal sources to the RF device.

In a possible embodiment, the positioner can comprise a mechanical arm with three degrees of freedom. Such a mechanical arm, like e.g. a robot arm, can rotate the RF device not only around the first axis but also around a second and a third axis. Together the three axis can e.g. form a Cartesian coordinate system. The mechanical arm may have more degrees of freedom, e.g. for moving the base of the mechanical arm.

In a possible embodiment, the positioner can comprise a set of three circular gimbals one mounted in the other with orthogonal pivot axes. This alternative mechanical arrangement provides a very compact construction for rotating the RF device in the three axis.

It is understood, that the above described system can e.g. be placed in an anechoic chamber, and that the respective measurements can be performed in the anechoic chamber.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

DETAILED DESCRIPTION OF THE DRAWINGS

Figure 1:
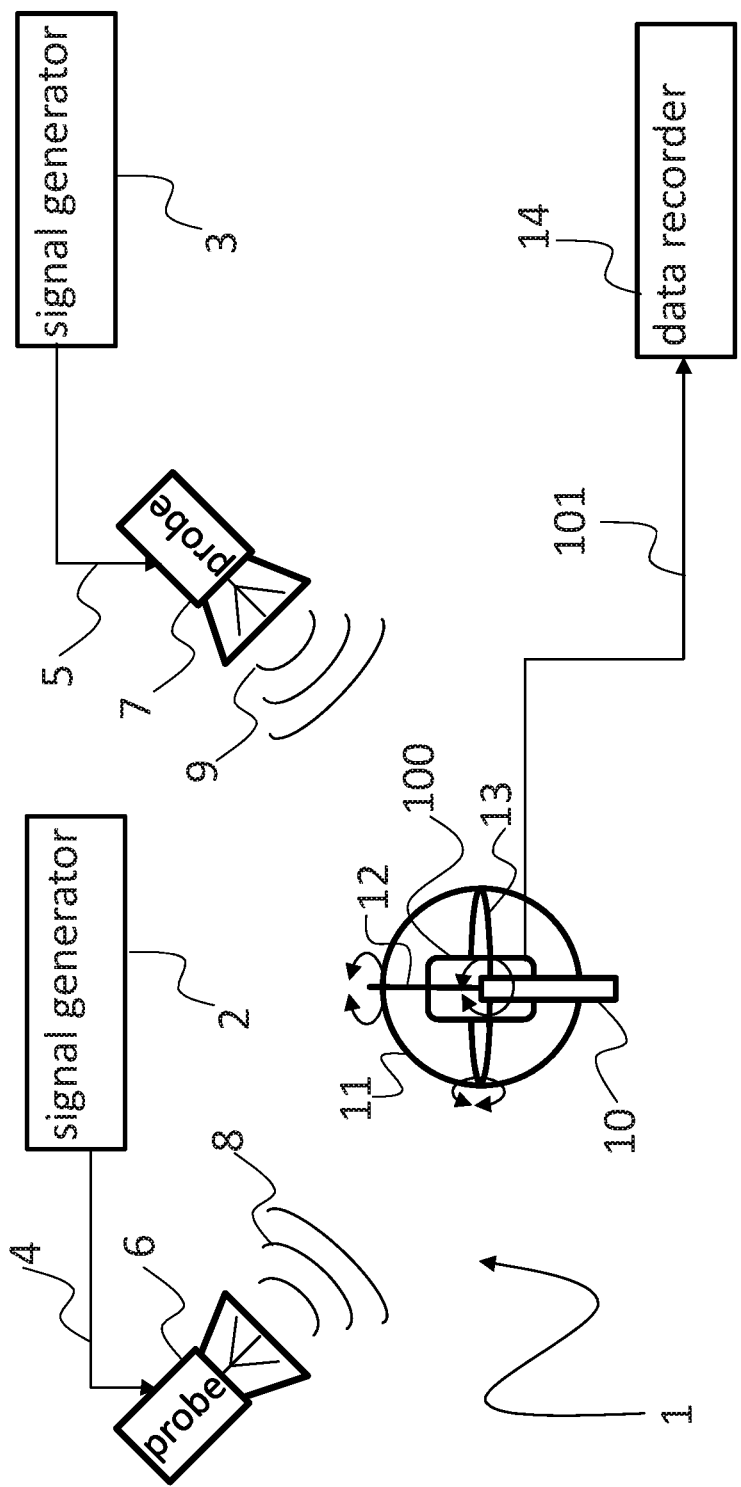
FIG. 1 shows a block diagram of an embodiment of a measurement system according to the present invention.

FIG. 1 shows a measurement system 1. The measurement system 1 comprises two signal generators 2, 3, which each generate a test signal 4, 5 for one of the probes 6, 7. The probes 6, 7 transmit the test signals 4, 5 as wireless signals 8, 9 to the device under test, DUT, 100, which is fixed in a 3D positioning device 10, which can rotate the DUT 100 around the X-, Y-, and Z-Axis.

Figure 4:
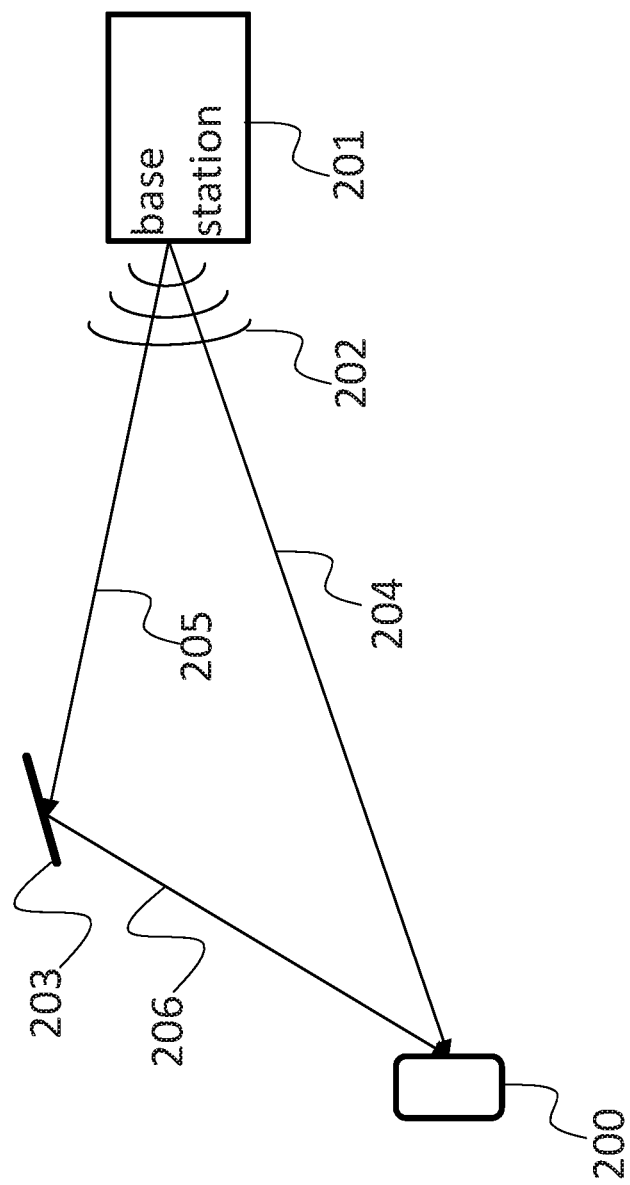
FIG. 4 shows a diagram of signal emissions of a base station.

The signal generators 2, 3 will each generate the test signal 4, 5 as if the respective test signal 4, 5 was emitted by the same signal source but transported to the DUT 100 via different signal propagation paths (see FIG. 4 for details). That means that the signal generators 2, 3 e.g. simulate the influences of the different signal propagation paths from the source to the DUT 100. Such influences can especially refer to phase changes, polarization changes or frequency changes of the respective base signal.

The 3D positioner 10 comprises a set of three circular gimbals 11, 12, 13 one mounted in the other with orthogonal pivot axes. This allows rotating the DUT 100 in any angle in three dimensional space. It is understood, that any other mechanical structure, like e.g. a robot arm, can be used to rotate the DUT 100.

When a TIS measurement is performed one probe 6 can e.g. be provided with a test signal 4, which characterizes the base signal received by the DUT 100 via a direct line of sight. Further, the other probe 7 can e.g. be provided with a test signal 5, which characterizes the base signal received by the DUT 100 indirectly via reflection, i.e. via a non-direct line of sight. The test signals 4, 5, can especially be constant, i.e. signals with a constant amplitude, a constant phase, and a constant frequency. However, the test signals 4, 5 can also represent signals emitted from different signal sources to the DUT 100.

While the test signals 4, 5 are emitted by the probes 6, 7 as wireless signals 8, 9 to the DUT 100, the DUT 100 can be rotated. This rotation can e.g. be performed step-wise in the X-, Y-, Z-axis, such that the DUT 100 performs a full 360° rotation in every axis while the TIS measurement is performed. During the rotation, the DUT 100 can then record or measure the received wireless signals 8, 9 and provide respective measurement results 101.

In FIG. 1 the measurement results 101 are provided to an optional data recorder 14, which records at least the signal strengths of the wireless signals 8, 9 as received by the DUT 100. The data recorder 14 can also record other parameters of the wireless signals 8, 9, like e.g. the phase, the frequency, the amplitude or the like.

These results can then be further analyzed or visualized. The measurement system 1 can e.g. comprise a conformity evaluation unit, which evaluates the measurement results 101 and verifies if they conform to given legal or standard requirements.

Figure 2:
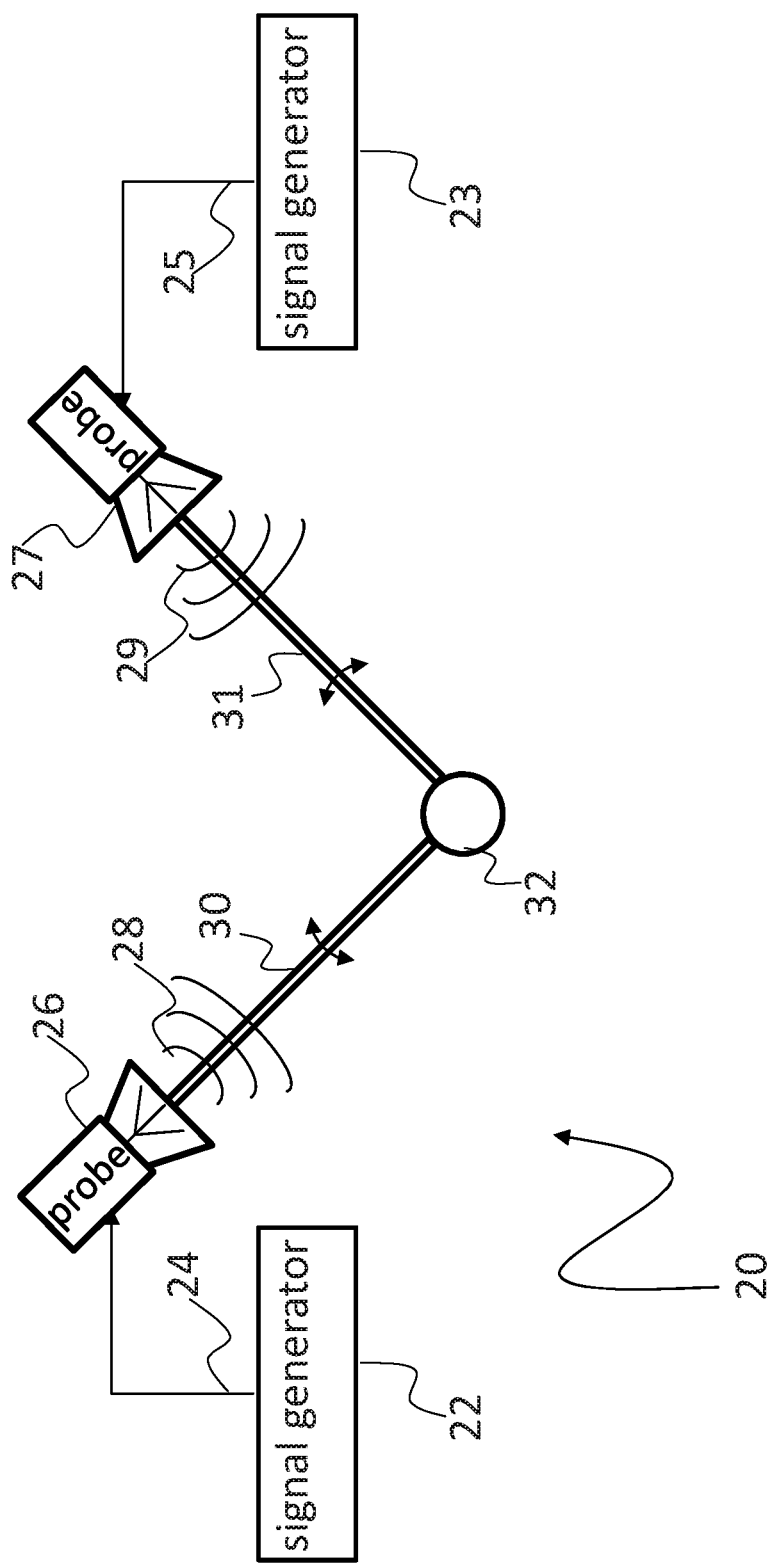
FIG. 2 shows a block diagram of another embodiment of a measurement system according to the present invention.

FIG. 2 shows another measurement system 20, which is based on the measurement system 1 of FIG. 1. Similar elements are provided with similar reference signs, but increased by 20.

The probes 26, 27 are rotatably mounted on rods 30, 31, which allow rotating the probes 26, 27 around a central fixture 32. The rods 30, 31 and the respective probes 26, 27 can therefore be rotated like the hands of a clock. With the help of this arrangement, therefore any incident angle of the wireless signals 28, 29 can be provided to the DUT.

Figure 3:
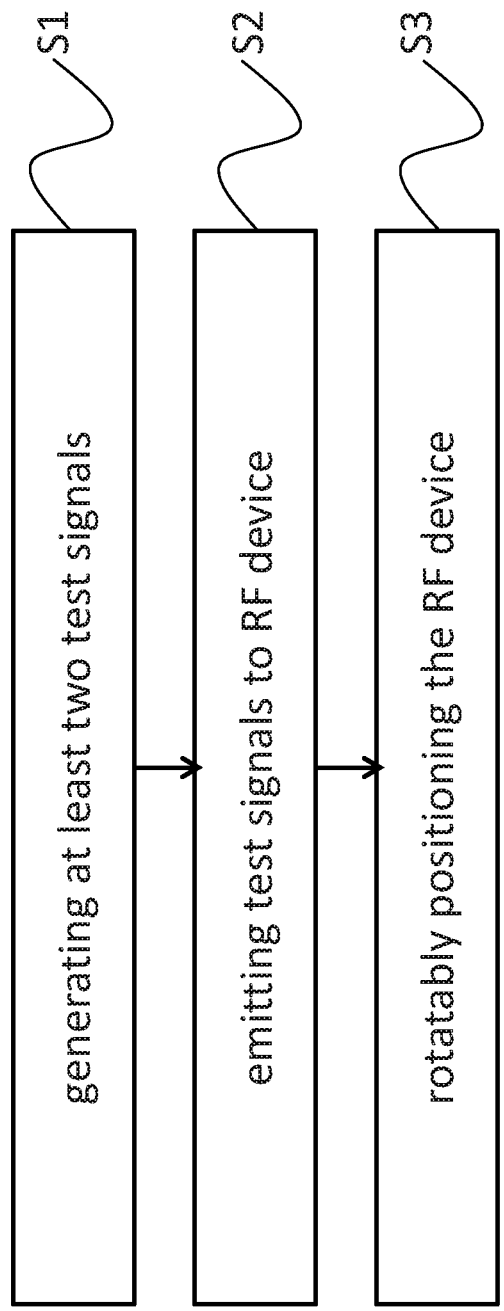
FIG. 3 shows a flow diagram of a method according to the present invention.

FIG. 3 shows a flow diagram of a method for measuring signals in a RF device 100.

The method comprises generating S1 at least two test signals 4, 5, 24, 25. Each test signal 4, 5, 24, 25 can characterize a signal emitted from a single signal source to the RF device 100 via diverging paths or emitted from different signal sources to the RF device. At least one of the test signals 4, 5, 24, 25 can characterize a signal received by the RF device 100 via a direct line of sight. Further, at least one of the test signals 4, 5, 24, 25 can characterize a signal received by the RF device 100 indirectly via reflection. The test signals 4, 5, 24, 25 can also represent signals emitted from different signal sources to the RF device 100.

The respective test signals 4, 5, 24, 25 are then emitted S2 to the RF device 100 with one probe 6, 7, 26, 27 for each test signal 4, 5, 24, 25.

The RF device 100 is further rotatably positioned S3 with respect to the probes 6, 7, 26, 27, while the measurement is performed. Rotatably positioning in this case refers to positioning the RF device 100 in a position rotated around a center of rotation lying in or near the center, e.g. the geometrical center or the center of gravity, of the RF device 100. The RF device 100 can be rotated for a specific measurement into a specific position. However consecutive measurements can be performed with the RF device 100 being moved into a new rotational position for every measurement.

The probes 6, 7, 26, 27 can be rotatably positioned around a first axis. Further, the RF device 100 can be positioned on the first axis. It is further possible to vary the distance of the probes 6, 7, 26, 27 to the axis.

The method can also comprise recording at least the signal strengths 101 of the test signals 4, 5, 24, 25 received at the RF device 100. Further, other parameters of the test signals 4, 5, 24, 25 can be recorded, like e.g. the phase, the frequency and the amplitude.

FIG. 4 shows a diagram of signal emissions from a base station 201 to a RF device 200. In FIG. 4 the base station emits a signal 202, which reaches the RF device 200 via two different signal paths 204, 205+206. The signal path 204 is a direct signal path, which e.g. represents a line of sight signal transmission. The second signal path comprises two sections 205, 204. The first section 205 represents the transmission of the signal 202 to the obstacle 203. The second section 206 represents the signal transmission of the signal 202 from the obstacle 203 to the RF device 200.

The reflection of the signal 202 at the obstacle 203 can modify the signal 202. Signal generators of the present invention can be configured to simulate exactly these modifications and provide the resulting signal to the RF device 200.

It can be seen in FIG. 4, that a plane is defined by the RF device 200, the base station 201 and the object 203, i.e. by three vertex in the three dimensional space.

By providing a rotatable fixture for the RF device 200, the RF device 200 can be positioned in any angle with respect to this plane. This facilitates in depth measurements of the RF device 200.

It is understood, that at least part of the elements of the measurement system of part of the functions of the method according to the present invention can be implemented as computer program, programmable hardware or any combination of these.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily drawn to scale relative to each other. Like reference numerals designate corresponding similar parts.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

What is claimed is:

1. A measurement system for measuring signals in a RF device, the measurement system comprising:
    at least two signal generators for generating a RF test signal in each one of the signal generators;
    a probe for every signal generator, each probe being connected to the respective signal generator for emitting the respective RF test signal to the RF device;
    a controllable positioner for rotatably positioning the RF device with respect to the probes the positioner comprises a set of three circular gimbals one mounted in the other with orthogonal pivot axes; and
    rods for every probe, wherein each rod is adapted to individually rotate a respective probe around a central fixture, so that the probes are rotatable around a first axis.

2. The measurement system of claim 1, comprising a data recorder for recording at least the signal strengths of the RF test signals received at the RF device.

3. The measurement system of claim 1 wherein the RF device is positioned on the first axis.

4. The measurement system of claim 1 wherein the distance of the probes to the axis is configurable.

5. The measurement system of claim 1, wherein at least one of the RF test signals characterizes a signal received by the RF device via a direct line of sight.

6. The measurement system of claim 1, wherein at least one of the RF test signals characterizes a signal received by the RF device indirectly via reflection and/or wherein every RF test signal characterizes a signal emitted from a single signal source to the RF device via diverging paths or emitted from different signal sources to the RF device.

7. The measurement system of claim 1, wherein the positioner comprises a mechanical arm with three degrees of freedom.

8. A method for measuring signal strength in a RF device, the method comprising:
   generating at least two RF test signals;
   emitting the respective RF test signals to the RF device with one probe for each RF test signal; and
   rotatably positioning the RF device with respect to the probes by rods (30, 31) for every probe, wherein rotatably positioning comprises positioning with a positioner comprising a set of three circular gimbals one mounted in the other with orthogonal pivot axes, wherein each rod is individually rotated by a respective rod around a central fixture, so that the probes are rotatable around a first axis.

9. The method of claim 8, comprising recording at least the signal strengths of the RF test signals received at the RF device.

10. The method of claim 8, comprising positioning the RF device on the first axis.

11. The method of claim 8, wherein the distance of the probes to the axis is configurable.

12. The method of claim 8, wherein at least one of the RF test signals characterizes a signal received by the RF device via a direct line of sight.

13. The method of claim 8, wherein at least one of the RF test signals characterizes a signal received by the RF device indirectly via reflection; and/or wherein every RF test signal characterizes a signal emitted from a single signal source to the RF device via diverging paths or emitted from different signal sources to the RF device.

14. The method of claim 8, wherein rotatably positioning comprises positioning with a positioner comprising a mechanical arm with three degrees of freedom.

* * * * *